(12) United States Patent
Mankaruse et al.

(10) Patent No.: US 6,411,512 B1
(45) Date of Patent: Jun. 25, 2002

(54) HIGH PERFORMANCE COLD PLATE

(75) Inventors: Magda Mankaruse; Nagui Mankaruse, both of Sunset Beach, CA (US)

(73) Assignee: Delta Engineers, Huntington Beach, CA (US)

( * ) Notice: Subject to any disclaimer, the term of this patent is extended or adjusted under 35 U.S.C. 154(b) by 11 days.

(21) Appl. No.: 09/718,611

(22) Filed: Nov. 21, 2000

Related U.S. Application Data (63) Continuation-in-part of application No. 09/343,005, filed on Jun. 29, 1999.

(51) Int. Cl.[7] ................................................ H05K 7/20
(52) U.S. Cl. ................ 361/700; 165/80.4; 165/104.33; 174/15.1; 174/15.2; 361/701
(58) Field of Search ..................... 62/259.2; 165/80.4, 165/104.33, 104.32; 257/715; 361/688–689, 699–704, 707, 711; 174/15.1–15.2

(56) References Cited

U.S. PATENT DOCUMENTS 5,409,055 A * 4/1995 Tanaka et al. .............. 361/700
5,812,372 A * 9/1998 Galyon et al. .............. 361/699

* cited by examiner

*Primary Examiner*—Gregory Thompson
(74) *Attorney, Agent, or Firm*—Drummond & Duckworth; David G. Duckworth (57) ABSTRACT

A cold plate assembly for cooling a heat source is disclosed. The cold plate assembly includes a rectangular base having an inner surface for thermally interfacing with the heat source. Machining or casting or molding a contour to interface with the heat source forms the base. A heat pipe thermal plane or individual heat pipes are selected to conform to the thermal cooling capacity of the cold plate assembly. One or two compact heat exchangers are selected to remove the heat conducted through the base to the cooling fluid used in the compact heat exchanger. The three modules are bonded together to form the cold plate assembly.

10 Claims, 6 Drawing Sheets

HIGH PERFORMANCE COLD PLATE

The present invention is a continuation-in-part of a prior filed non-provisional patent application having Ser. No. 09/343,005 and an official filing date of Jun. 29, 1999 and which discloses substantially the same material as described herein.

BACKGROUND OF THE INVENTION

1. Field of the Invention

The invention relates generally to, liquid-cooling systems for high power dissipating electronic components mounted on printed circuit boards and more specifically a cost effective, high performance, high reliable cold plate.

2. Description of Related Art

Electronic circuit board assemblies tend to generate varying levels of heat to be dissipated during operation. If left unchecked, component overheating may affect performance or even failure of the electronic components. For relatively low-power systems, air cooling and heat sink techniques often adequately maintain lower operating temperatures to such electronic components. Application of printed circuit boards that employ high power electronic components demanded by such equipment used, often require liquid cooling to minimize the cooling system size, and heat transfer medium required transmitting larger amount of heat rate using relatively smaller size cooling system.

Several different liquid-cooling methods have been proposed in the field of cooling high power dissipating electronic components mounted on printed circuit boards. One of the more popular liquid-cooling mechanisms employs an aluminum cover assembly that mounts to a circuit board in overlaying close-fitting relationship to the surface-mounted electronics. This kind of cooling apparatus is commonly referred to as a cold plate.

Conventional cold plates typically comprise a relatively flat thermally conductive body formed with an engagement surface that closely mirrors the surface configuration or topology of the circuit board. An internal cooling channel is formed in the plate to circulate cooling fluid through the body and draw heat away from the cold plate during operation. The plate mounts to the circuit board with the respective electronic components nested in corresponding close-fitting recesses.

While conventional cold plates offer significant cooling advantages for printed circuit boards, as compared to air-cooled systems, some of the drawbacks involve cost and reliability. Typically, the costs associated with cold plates often reflect long lead times and complex manufacturing operations, which most often may lead to lower reliability. Consequently the expense to employ a traditional cold plate system coupled with reliability issues in a printed circuit board environment is often undesirably high cost and lower reliability.

In an effort to address these problems, those skilled in the art have advanced many proposals for design and manufacturing cold plates reflecting the generally structure described above. One method disclosed in U.S. Pat. No. 4,196,775. Involving selecting a thin tube, and casting the plate around the tube to construct the internal fluid channel. A variant on this technique utilizes a plurality of parallel tubes to improve the surface area of the coolant-to-plate interface. While this "tube" technique works well for its intended low-flow applications, the limited surface area at the coolant-to-plate interface generally restricts the cooling capability to relatively lower heat dissipation levels.

Another conventional method of design and manufacturing cold plates omits the tubes, employs the steps of machining or casting two oppositely confronting halves of a cold plate. The confronting surfaces of each cold plate half are each respectively formed with complemented inwardly opening cavities, that, when brought together, form a complete fluid channel. The two halves are then brought together and vacuum brazed to form an integral cold plate unit.

While this method works well for its intended applications, the costs involved in machining the two halves, and carrying out the relatively complex vacuum brazing step are often undesirably high. Moreover, the vacuum brazing step generally minimizes the cold plate production throughout because of the low allowable tolerances involved when carrying out the vacuum brazing process.

What is needed and has been heretofore unavailable is a high-performance, cost-effective cold plate configuration that lends itself to a high level of manufacturability, and a method that implements straightforward design and fabrication steps to minimize costs and production delays, which in turn simplifies the design of the cooling system, and its components. The cold plate and method of the present invention satisfies these needs.

The prior art teaches the use of heat dissipation devices for maintaining temperature in electrical and electronic circuits, but does not teach such a device having the features of high performance, low cost and ease of manufacture. The present invention fulfills these needs and provides further related advantages as described in the following summary.

SUMMARY OF THE INVENTION

The apparatus and method of this invention provide cost-effective, high performance and modular way or producing cold plate configuration that is capable of being produced and assembled through putting together three modules. The three modules are produced by mass production techniques and are ready to form the cold plate assembly. Substantial costs and delays in fabrication are minimized in addition to increase in reliability, which lower the breakdown risk level or increase the mean time between failure (MTBF).

To realize the foregoing advantages, the invention in one form comprises a cold plate assembly for cooling heat sources on a printed circuit board, i.e., the high power dissipating electronic components. The cold plate assembly comprises three modules including: a thermally conductive base having an outer surface for thermal interface with a heat source, a heat pipe thermal plane or individual heat pipes to transmit the heat from the heat source with minimum thermal gradient, and one or two compact heat exchangers of laminated or finned construction, depending on the application; where the heat is transferred to a cooling fluid for removal.

The invention comprises a method of fabricating a cold plate assembly that achieves a greater homogeneity of temperature through the printed circuit board in order to avoid any localized heating which might adversely affect the electronic components. Consequently, the invention likewise has as one object, the provision of a printed circuit board with improved thermal characteristics. This allow it to dissipate a greater flow of heat in the direction of the one or two heat exchangers mounted on the farther ends of the cold plate base with minimum thermal gradient. Printed circuit board assemblies require increased thermal capability needed by new technology. Using this cold plate for cooling, printed circuit board assemblies can employ increasing power or heat flux density from its components and maintain component junction temperature within specification limits. Also this invention realizes easy way to production of cold plates and put into service. The invention also improve the reliability of the cold plate, since none of the elements that make the cold plate have moving elements, they are extremely reliable.

The advantages of this invention are all a direct result of using first, the heat pipe thermal plane or individual heat pipes. The heat pipe technology allows heat transfer with an extremely high and effective thermal conductivity. As a passive device, heat pipe thermal plane is a plate utilizing embedded copper/water heat pipes to carry the heat from components to a liquid or air cooled cold wall. While cooling at both edges in recommended for maximum plate performance, single edge cooling is possible for derated performance. The heat pipe thermal plate operation is insensitive to mounting orientation. The heat pipe is a heat transfer device with extremely high effective thermal conductivity. Heat pipes are evacuated vessels, typically circular in cross sections, which are back-filled with a small quantity of a working fluid. They are totally passive and are used to transfer heat from a heat source (electronic components) to a heat sink (heat exchanger) with minimal temperature gradients. They are also used to isothermalize surfaces. Heat pipes transfer heat by the evaporation and condensation of a working fluid. As heat is input at the evaporator, fluid is vaporized, creating a pressure gradient in the pipe. This pressure gradient forces the vapor to flow along the pipe to the cooler section where it condenses, giving up its latent heat of vaporization. The working fluid is then returned to the evaporator by capillary forces developed in the porous wick structure or by gravity. The heat pipe thermal plane or individual heat pipes used in this invention utilizes working fluid range from ammonia, water, acetone and methanol. The compact heat exchanger is efficient with high heat transfer density.

The method of fabricating the cold plate includes the steps of: 1) selecting a plate of thermally conductive material, 2) selecting a heat pipe thermal plane or individual heat pipes that meets the dimensions and heat transfer capacity needed to cool the printed circuit board electronic components, and 3) selecting the type and size of the one or two laminated or finned compact heat exchangers depending on the heat capacity to be dissipated. The bonding of the three modules is completed as shown in the figures.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings.

DETAILED DESCRIPTION OF THE INVENTION

The above described drawing figures illustrate the invention in at least one of its preferred embodiments, which is further defined in detail in the following description.

Referring to the figures, a conductive cold plate 25 of the present invention employs an easily manufactured modular construction made of three modules or elements. The three modules including a thermally conductive base 2, a heat pipe assembly 20, and compact heat exchanger 14 are described below.

A thermally conductive base 2 comprises a rectangular shaped plate of thermally conductive material, and provides a circuit board engagement interface. The interface is formed with a series of recesses that mirror the surface component topology of a circuit board 1, and a standoff 10 for mounting the cold plate 25 to the board 1. This thermally conductive base 2 is preferably made from machined aluminum alloy 6061 T6. In case of mass production to further reduce the cost of this module, die case aluminum alloy, brass or high conductivity polymer composite can be used.

Figure 3:
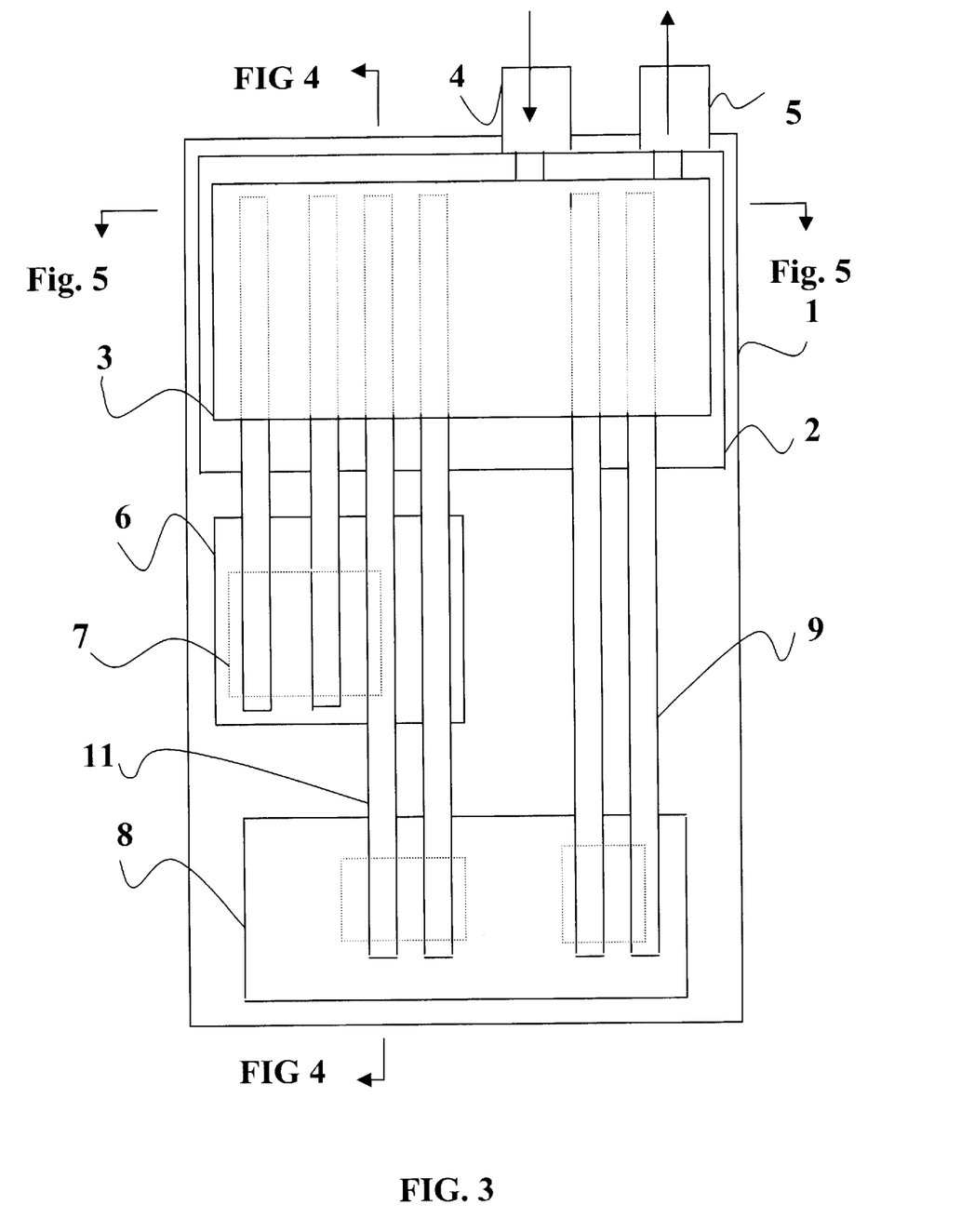
FIG. 3 is a top plan view of a cold plate assembly using individual heat pipes.

A heat pipe assembly 20 is preferably constructed as a thermal plane utilizing embedded copper/water heat pipes 9 & 11 sandwiched between two outer aluminum plates. The heat pipes thermal plane utilizes embedded heat pipes to carry the heat from components (the heat source) to the heat sink (heat exchangers) with a typical source to sink temperature difference of 20 degrees centigrade or less. While cooling at both edges is recommended for maximum heat pipe thermal plane performance, single edge cooling is possible with lower performance. Operation is sensitive to orientation of the heat pipes 9, shown in FIG. 3 and FIG. 4. A heat pipe 9 is a heat transfer device with an extremely high effective thermal conductivity. Heat pipes are evacuated vessels typically circular in cross section which are back filled with a quantity of a working fluid and they are totally passive as used to transfer heat from a source (electronic components) to a sink (heat exchangers) with minimal temperature gradient or to isothermalize a surface. Common heat pipe fluids used are ammonia, water, acetone, and methanol. The heat pipe thermal plane 20, shown in FIG. 1, and heat pipes 9 shown in FIG. 3 are selected depending on the cooling system parameters to carry the heat from the electronic components through the base 2 to the cooling fluid in the heat exchanger 14. When using two compact heat exchangers at the edges of the cold plate base 2, cold plate performance is maximized due to maximum performance of heat pipe thermal plane. Single edge cooling using one heat exchanger is possible with slight de-rated performance. The efficiency of the cold plate 25 is dependent on mounting orientation as noted previously.

With reference to the figures, preferably a heat exchanger 2 and 14 is disposed at one or both opposite ends of heat pipe assembly 20. Preferably, the one or two heat exchangers are either laminated or finned. Moreover, preferably the heat exchanger is made of aluminum or copper and sized to accommodate the heat dissipation capacity of the printed circuit board. The flow rate of flow of the cooling fluid required is determined in proportion to the heat removal capacity of the cold plate 25, and a junction temperature range is maintained for the cooled electronic components mounted on the printed circuit board. With reference to FIG.

Figure 1:
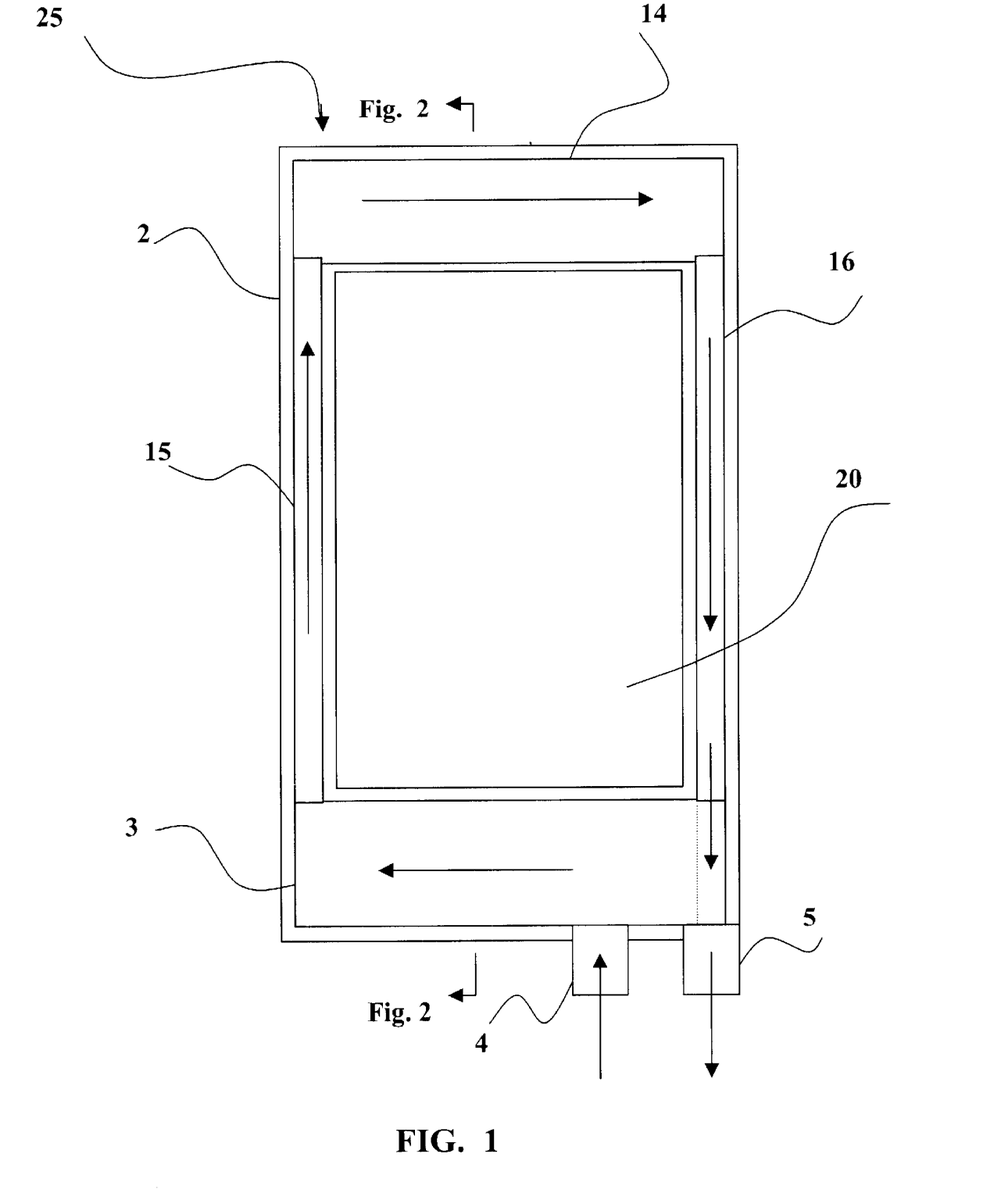
FIG. 1 is a top plan view of a cold plate assembly according to the invention.

1, where two heat exchangers are provided, preferably, both are connected together with two aluminum or copper pipes 15 and 16 to transmit the cooling fluid. The pipes are connected to the inlet and outlet of the heat exchangers. The path of the cooling fluid is from an inlet quick disconnect 4 to the lower heat exchanger 3, then to pipe 15 and through the upper heat exchanger 14 to the pipe 16, and finally, out through the quick disconnect 5.

Figure 2:
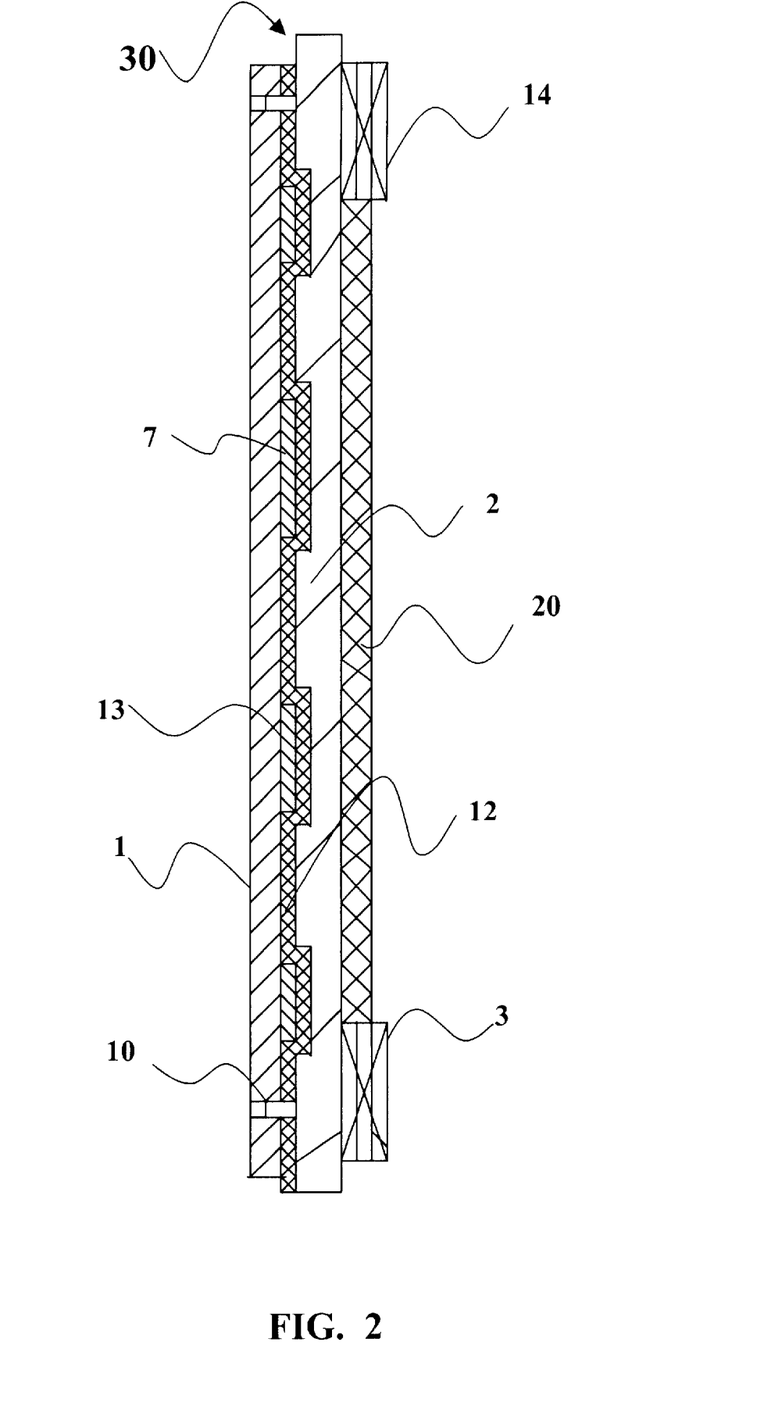
FIG. 2 is an enlarged cross-sectional view of the cold plate assembly attached to a printed circuit board shown taken along line 2—2 of FIG. 1.

Referring to FIG. 2 the three module cold plate base 2, heat pipe thermal plane 20, and heat exchangers 3 and 14 are assembled together using high thermal conductive adhesives or any other thermally conductive bonding technique on the cold plate base outer surface. A template or fixture (not shown) is used to accurately locate the three modules in place relative to the controlling dimensions in the assembly process of the cold plate 25. The circuit board 1, with electronic component item 13, to be cooled is mounted on printed circuit board 1, and gap filler 35 is placed between the circuit board 1 and base plate 2. The circuit boards cooled by the cold plate in this invention are not limited in size, since heat pipe thermal or individual heat pipes can be custom designed to accommodate the cold plate size to cool the circuit board electronic components. Also the heat transmission capacity of the heat pipe thermal plane 20 can be customized to maximize the capacity and performance by changing the length, width and thickness of the heat pipe thermal plane 20. With reference to FIG. 3, the working fluid in the heat pipe thermal plane 20 can be of different types and, similarly the individual heat pipes 9, can be of different sizes (diameter, length, etc.) to accommodate the cooling capacity and the dimensions of the assembly. In the industry there are standard sizes of the heat pipe thermal plane 20 predesigned and available for production orders. In the case of using a heat pipe thermal plane, the use of the standard size of the heat pipe thermal plane reduces the cost of this module in the cold plate of this invention over the use of customized heat pipe thermal planes.

Figure 4:
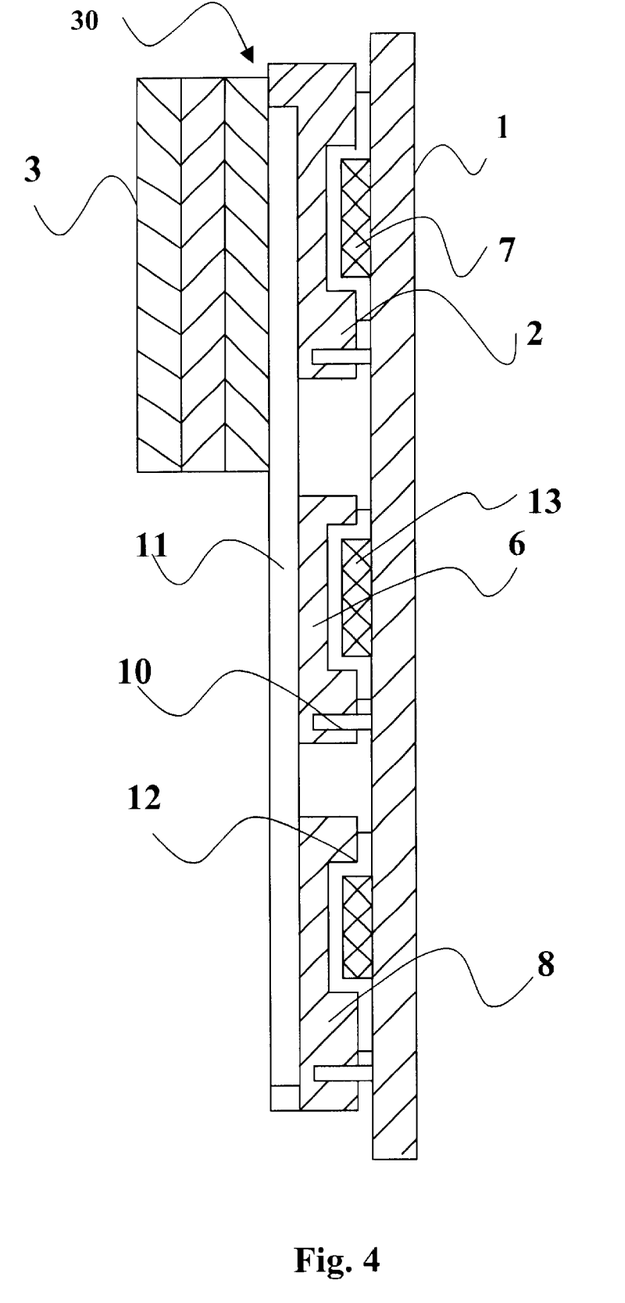
FIG. 4 is an enlarged cross-sectional view of a cold plate assembly attached to a printed circuit board shown taken along line 4—4 of FIG. 3.
Figure 5:
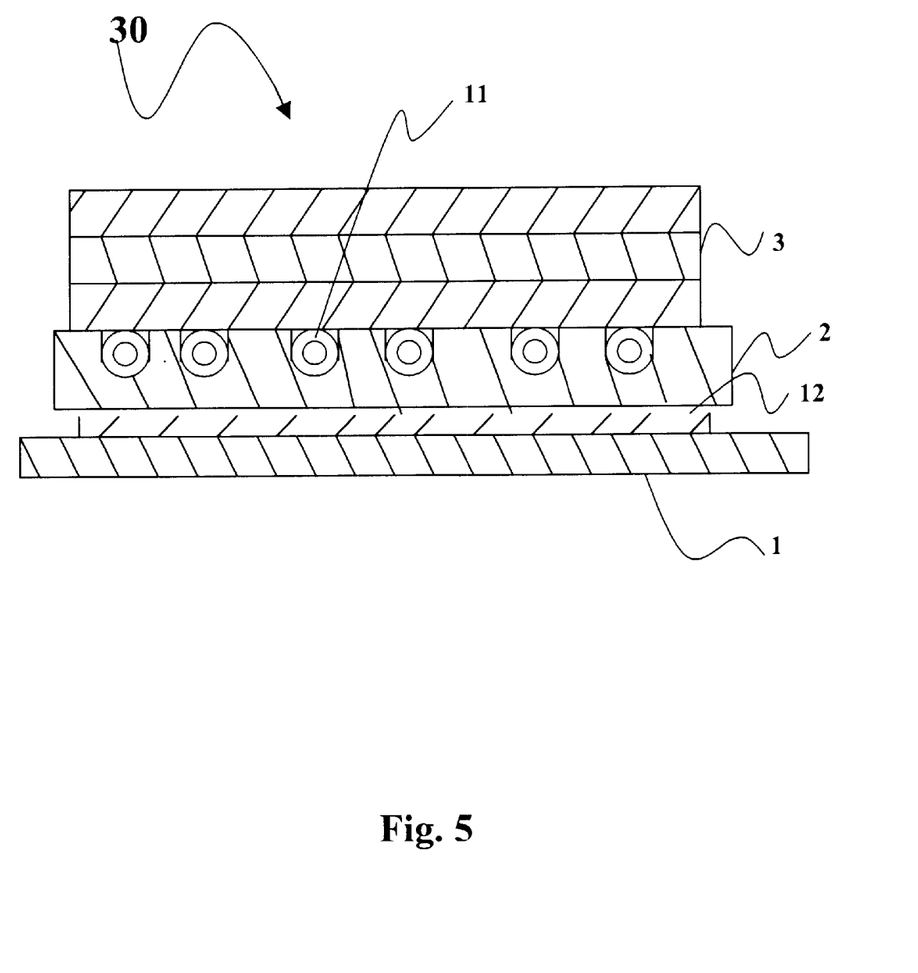
FIG. 5 is a cross-sectional view of a cold plate assembly using individual heat pipes attached to a printed circuit board shown taken along line 5—5 of FIG. 3.

Referring now to FIGS. 3–5, the cold plate 25 of the present invention, generally employs a highly manufacturable modular construction, including a thermally conductive base, individual heat pipes, and plural heat exchangers. The cold plate 25 includes a rectangular shaped base plate of thermally conductive material such as aluminum, brass or high conductive polymer composite, having a circuit board engagement interface. The interface is formed with a series of recesses that mirror the surface component topology of the circuit board, with thermally conductive gap filler material (not shown). Reference numeral 3 refers to a laminate or finned heat exchanger. Reference numerals 4 and 5 refer to quick disconnects for the cooling fluid entering and exiting the heat exchanger. Reference numeral 7 refers to an electronic component to be cooled. Reference numeral 9 refers to the heat pipes. Reference numeral 2 refers to a thermally conductive base. Reference numeral 12 refers to a gap filler material. Reference numeral 10 refers to an alignment pin.

With reference to FIGS. 3–5, in an additional embodiment of the present invention, the three modules of the cold plate assembly are a cold plate base 2, individual heat pipes defining a heat pipe assembly 20, and one or more heat exchangers 3. The three modules are assembled together using brazing material like thermally conductive adhesive or soldering material or any other thermally conductive bonding technique. The individual heat pipes are bonded to the thermally conductive base's outer surface, by providing cavities to house the individual heat pipes. The heat exchanger 3 then is bonded to the cold plate base 2 using thermally conductive bonding material. A template or fixture is used to accurately locate the three modules in place relative to the controlling dimensions in the assembly process of the cold plate.

Figure 6:
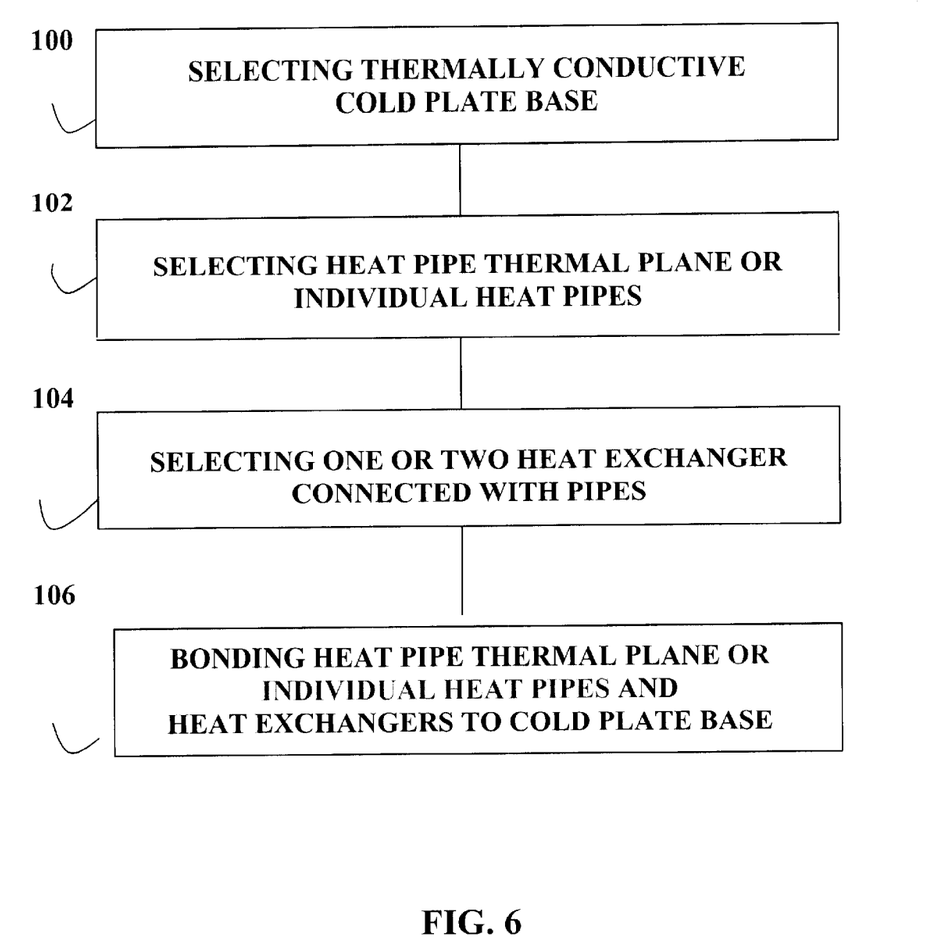
FIG. 6 is a block diagram illustrating steps employed according to one embodiment of the method of the present invention.

Referring now to FIG. 6, the structure of the cold plate assembly 25 enables the implantation of relatively straightforward assembly steps. Manufacturing the cold plate begins in step 100, with selecting a thermally conductive plate to define the base. Either casting or machining the profile of the topology on the far side forms the base. Then selecting the heat pipe thermal plane or individual heat pipes at step 102. Selecting the compact heat exchanger with the pipes in step 104.

Once the three main modules are selected, bonding them together as shown in FIGS. 1–5 makes the assembly of the cold plate step 106. Using a thin layer of high thermal conductive adhesive makes the bond. While the inventor has determine bonding using high thermally conductive adhesive offers the preferred results, other known processes may be employed without damaging the heat pipe thermal plane or the individual heat pipes.

Assembling the cold plate includes the base, the heat pipe thermal plane or individual heat pipes and the heat exchangers. The thermal capacity of transmitting the heat as determined by the main parameters of the heat pipe thermal plane or individual heat pipes. For a properly designed heat pipe thermal plane or individual heat pipes, depending on parameters, capacity for transmitting heat energy can handle applications with peak thermal flux range of more than 80 watts/square centimeter at the interface. Effective the thermal conductivity of the heat pipe thermal plane or individual heat pipes can virtually range over several multiples the effective thermal conductivity of copper depending on the parameters of the heat pipes used. The compact heat exchanger capacity for removing the heat to the cooling fluid is determined by the selected heat exchangers capacity. This defines the temperature level and the cooling capacity of the cold plate.

The cooling of high-power printed circuit boards is accomplished in this invention with cold plates mounted with the engagement interface positioned directly on the electronic component surface. Thermal putty interface material gap filler applied at the circuit board-to-cold plate interface junction ensures diminished air gaps to maximize the cooling effect of the cold plate.

In operation, the printed circuit board assembly generates heat according to the level of power dissipated in the electronic components. To maintain a substantial stable temperature, the coolant source not shown, provides pressurized coolant at a temperature of approximately twenty-five degrees C to the cold plate heat exchanger inlet 4. Using a preferred coolant, either water, glycol water coolant EGW fluid, hydrofluoroethers (HFE's) such as HFE-7100, perfluorocarbons PFC's and perfluoroamines manufactured by the 3 M Company®. Coolanol 25®, and 45® manufactured by Monsanto Chemical Company®, DC-200 manufactured by Dow Corning Company®, or any other cooling fluid suitable to the application to remove the heat away from the electronic component through the heat pipe thermal plane or individual heat pipes to the heat exchanger. As the coolant transverses the inlet and outlet fluid paths, heat is conducted through the cold plate base 2 and transmitted by the heat pipe thermal plane or individual heat pipes to the other ends to the heat exchangers and coolant fluid. The coolant fluid carries away a portion of the thermal energy to effect the desired cooling and exits the cold plate outlet.

Those skilled in the art will appreciate the many benefits and advantages afforded by the present invention. Of particular importance the straightforward modular design of the cold plate, which is made of the three modules assembled together. This minimizes cost, not only through the inexpensive assembly process employed, but throughput the assembled cold plates.

While the invention has been particularly shown and described with reference to the preferred embodiments thereof, it will be understood by those skilled in the art that various changes in form and detail may be made therein without departing from the spirit and scope of the invention.

What is claimed is:

1. A cold plate assembly for cooling a circuit board assembly, said cold plate assembly comprising:
   a heat pipe assembly including at least one heat pipe adapted for internally circulating a first thermally conductive fluid for carrying heat dissipated from electrical components of a circuit board; and
   at least one compact heat exchanger engaging and thermally connected to said heat pipe assembly, said heat exchanger adapted for internally circulating a second thermally conductive fluid and for carrying heat dissipated from said heat pipe assembly.

2. The cold plate assembly for cooling a circuit board assembly of claim 1, said cold plate assembly further comprising:
   a thermally conductive base engaging said heat pipe assembly for being affixed to a circuit board, said thermally conductive base including a plurality of recesses sized and configured for receipt of electrical components on a circuit board.

3. The cold plate assembly for cooling a circuit board assembly of claim 1, wherein said compact heat exchanger includes an inlet for receiving said second thermally conductive fluid and an outlet for emitting said second thermally conductive fluid.

4. The cold plate assembly for cooling a circuit board assembly of claim 1 wherein said heat pipe assembly is constructed as a thermal plane including at least one internal heat pipe.

5. A cold plate assembly for cooling a circuit board assembly, said cold plate assembly comprising:
   a thermally conductive base for being affixed to a circuit board, said thermally conductive base including a plurality of recesses sized and configured for receipt of electrical components on a circuit board;
   a heat pipe assembly engaging and thermally connected to said thermally conductive base, said heat pipe assembly constructed as a thermal plane including one or more internal heat pipes, said one or more heat pipes for internally circulating a first thermally conductive fluid for carrying heat dissipated from electrical components of a circuit board; and
   at least one compact heat exchanger engaging and thermally connected to said heat pipe assembly, said heat exchanger adapted for internally circulating a second thermally conductive fluid and for carrying heat dissipated from said heat pipe assembly, said component heat exchanger including an inlet for receiving said second thermally conductive fluid and an outlet for emitting said second thermally conductive fluid.

6. A circuit board and cold plate assembly comprising:
   a circuit board assembly including electronic components mounted thereon;
   a heat pipe assembly thermally connected to said electronic components, said heat pipe assembly including at least one heat pipe adapted for internally circulating a first thermally conductive fluid for carrying heat being dissipated from said electrical components; and
   at least one compact heat exchanger engaging and thermally connected to said heat pipe assembly, said heat exchanger adapted for internally circulating a second thermally conductive fluid and for carrying heat dissipated from said heat pipe assembly.

7. The circuit board and cold plate assembly of claim 6 further comprising a thermally conductive base affixed to said circuit board, said thermally conductive base provided to transfer heat from said electronic components to said heat pipe assembly.

8. The circuit board and cold plate assembly of claim 6 wherein said heat pipe assembly is constructed as a thermal plane including at least one internal heat pipe.

9. The circuit board and cold plate assembly of claim 6 wherein said compact heat exchanger includes an inlet for receiving said second thermally conductive fluid and an outlet for emitting said second thermally conductive fluid.

10. The circuit board and cold plate assembly of claim 9 wherein said heat pipe assembly is constructed as a thermal plane including at least one internal heat pipe.

* * * * *